United States Patent
Jaeger

(10) Patent No.: US 10,175,465 B2
(45) Date of Patent: Jan. 8, 2019

(54) OPTOELECTRONIC COMPONENT HAVING A RADIATION SOURCE

(71) Applicant: OSRAM Opto Semiconductors GmbH, Regensburg (DE)

(72) Inventor: Claus Jaeger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/577,907

(22) PCT Filed: May 24, 2016

(86) PCT No.: PCT/EP2016/061724
§ 371 (c)(1),
(2) Date: Nov. 29, 2017

(87) PCT Pub. No.: WO2016/193074
PCT Pub. Date: Dec. 8, 2016

(65) Prior Publication Data
US 2018/0164559 A1    Jun. 14, 2018

(30) Foreign Application Priority Data

May 29, 2015 (DE) .......... 10 2015 108 499

(51) Int. Cl.
| | |
|---|---|
| *G02B 17/00* | (2006.01) |
| *G02B 19/00* | (2006.01) |
| *H01L 33/58* | (2010.01) |
| *H01L 33/60* | (2010.01) |

(52) U.S. Cl.
CPC ..... *G02B 19/0028* (2013.01); *G02B 19/0061* (2013.01); *H01L 33/58* (2013.01); *H01L 33/60* (2013.01)

(58) Field of Classification Search
CPC . G02B 19/0028; G02B 19/0061; H01L 33/58; H01L 33/60
USPC ................. 359/726, 727, 838, 868
See application file for complete search history.

(56) References Cited

U.S. PATENT DOCUMENTS

| | | |
|---|---|---|
| 6,578,983 B2 | 6/2003 | Holten |
| 7,595,513 B2 | 9/2009 | Plank et al. |
| 2003/0067264 A1 | 4/2003 | Takekuma |
| 2003/0156416 A1 | 8/2003 | Stopa et al. |
| 2007/0115660 A1 | 5/2007 | Lee et al. |

(Continued)

FOREIGN PATENT DOCUMENTS

| | | |
|---|---|---|
| DE | 601 12 450 T2 | 2/2006 |
| DE | 102007007258 A1 | 8/2008 |

(Continued)

OTHER PUBLICATIONS

Notice of Reasons for Rejection dated Oct. 30, 2018, of counterpart Japanese Application No. 2017-559355, in English.

*Primary Examiner* — William Choi
(74) *Attorney, Agent, or Firm* — DLA Piper LLP (US)

(57) ABSTRACT

An optoelectronic component includes at least one radiation source that produced electromagnetic radiation, a reflector, and a lens, wherein the reflector deviates a part of the radiation of the radiation source into a desired beam direction, the lens deviates at least a part of the radiation of the radiation source into the desired beam direction, the lens has a first side face which is conical at least in some areas, the first side face faces toward the radiation source, and the reflector has a concave first section and a second convex section.

15 Claims, 5 Drawing Sheets

(56) References Cited

U.S. PATENT DOCUMENTS

| | | |
|---|---|---|
| 2012/0014115 A1 | 1/2012 | Park et al. |
| 2013/0049049 A1 | 2/2013 | Choi |
| 2013/0170208 A1 | 7/2013 | Kuwaharada et al. |
| 2013/0207148 A1 | 8/2013 | Kräuter et al. |
| 2015/0029728 A1 | 1/2015 | Hu et al. |

FOREIGN PATENT DOCUMENTS

| | | |
|---|---|---|
| DE | 10 2011 115 0 | 4/2013 |
| EP | 2 078 973 A1 | 7/2009 |
| EP | 2 287 932 A2 | 2/2011 |
| JP | 2004-519815 A | 7/2004 |
| JP | 2004-253477 A | 9/2004 |
| JP | 2005-174693 A | 6/2005 |
| JP | 2005-268166 A | 9/2005 |
| JP | 2007-102139 A | 4/2007 |
| JP | 2007-173561 A | 7/2007 |
| JP | 2007-281471 A | 10/2007 |
| JP | 2011-016320 A | 1/2011 |
| JP | 2014-3168 A | 1/2014 |
| WO | 96/13943 A1 | 5/1996 |
| WO | 2011/024641 A1 | 3/2011 |
| WO | 2012/060319 A1 | 5/2012 |
| WO | 2011/016295 A1 | 1/2013 |
| WO | 2012/049854 A1 | 2/2014 |
| WO | 2014/091076 A1 | 6/2014 |
| WO | 2015/101899 A1 | 7/2015 |

OPTOELECTRONIC COMPONENT HAVING A RADIATION SOURCE

TECHNICAL FIELD

This disclosure relates to an optoelectronic component having a radiation source.

BACKGROUND

It is known to use optoelectronic components, for example light-emitting diode components, for lighting purposes. In such cases, lenses are provided to carry out beam shaping of the electromagnetic radiation.

It could nonetheless be helpful to provide an improved optoelectronic component.

SUMMARY

I provide an optoelectronic component including at least one radiation source that produced electromagnetic radiation, a reflector, and a lens, wherein the reflector deviates a part of the radiation of the radiation source into a desired beam direction, the lens deviates at least a part of the radiation of the radiation source into the desired beam direction, the lens has a first side face which is conical at least in some areas, the first side face faces toward the radiation source, and the reflector has a concave first section and a second convex section.

Figure 1:
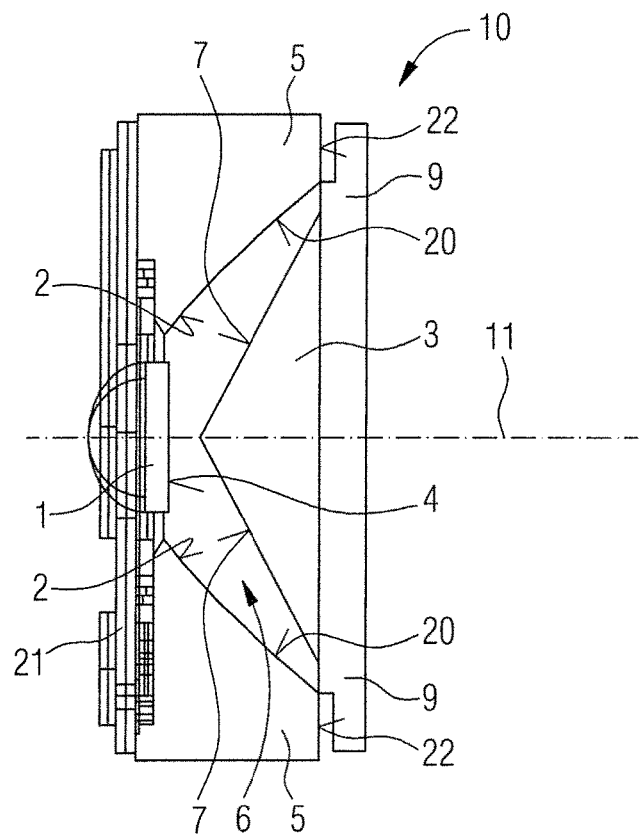
FIG. 1 shows a schematic cross section through a first example of an optoelectronic component.

LIST OF REFERENCES 1 radiation source
2 reflector
3 lens
4 emission side
5 housing
6 emission space
7 first side face
8 second side face
9 plate part
10 component
11 mid-axis
12 aperture surface
13 vertex
14 plane face
15 first annular face
16 second annular face
17 transition region
18 area
20 inner side
21 carrier
22 second side face of housing
23 central region
24 edge region
25 first section
26 second section
27 inflection line
28 groove
29 inner face
30 outer face
31 recess
32 first plate
33 second plate
35 upper end region
36 lower end region

DETAILED DESCRIPTION

My optoelectronic component has at least one radiation source, a reflector and a lens. The lens has a conical first side face facing toward the radiation source. The conical first side face is enclosed at least partially by the reflector. In this way, improved beam guiding of the electromagnetic radiation by the reflector and the lens is achieved. By virtue of the conical lens, the component and the reflector can be configured with a relatively small height. One advantage of the proposed component is that optical losses are reduced.

The first side face may be configured to be fully conical. This allows a simple structure of the lens.

The reflector may enclose the radiation source in the shape of a ring. The reflector delimits an emission aperture of the optoelectronic component. The first side face of the lens is configured such that the first side face covers at least 80% of the emission aperture. In this way, efficient beam shaping is achieved.

The first side face may cover at least 90% of the emission aperture of the reflector. The effect achieved by this is that a larger percentage of the electromagnetic radiation is guided through the first side face of the lens. Improved beam shaping is therefore achieved overall.

The lens may have at least partially a convex surface on a second side face arranged opposite the first side face. In this way, improved beam guiding is achieved.

The reflector may be formed on an inner side of a housing, the lens bearing on a side face of the housing. In this way, a simple structure of the optoelectronic component is achieved.

The lens may have a Fresnel structure on the second side face for beam shaping of the electromagnetic radiation.

The first side face of the lens may have a frustoconical shape. Furthermore, subsurfaces of the first side face may also be configured to be convex or concave. Although this increases the optical losses, nevertheless good beam guiding with relatively low optical losses is still made possible with these structures.

The reflector may have at least one concave section. In this way, improved beam guiding can be achieved, in particular with a small overall height of the reflector.

The reflector may have a concave first section and a second convex section. With the aid of the concave and convex sections, a further improvement of the beam guiding can be achieved with a small overall height of the reflector.

A cross section of the first section may narrow in the direction of the radiation source and, furthermore, a cross section of the second section may narrow in the direction of the radiation source. In this way, improved beam guiding can be achieved with a small height and small area of the reflector.

The second side face of the lens may have a circumferential groove. In this way, improved beam guiding can be achieved in the output of the radiation from the lens.

The second side face of the lens may have a central recess. The second recess can also improve the beam guiding during the output of the radiation.

The above-described properties, features and advantages, as well as the way in which they are achieved, will become more clearly and readily comprehensible in conjunction with the following description of the examples, which will be explained in more detail in connection with the drawings.

FIG. 1 shows a schematic representation of a cross section of an optoelectronic component 10. The optoelectronic component 10 has a radiation source 1 that emits electromagnetic radiation on an emission side 4. The radiation source 1 may, for example, be configured in the form of a light-emitting diode. Furthermore, the radiation source 1 may be configured in the form of a laser diode. The component 10 is enclosed on the emission side 4 by a reflector 2. In the example represented, the reflector 2 delimits in the shape of a funnel an emission space 6, through which the electromagnetic radiation of the radiation source 1 is emitted. In the example represented, the reflector 2 is formed on an inner side 20 of a housing 5. The housing 5 may be formed from a plastic, the inner side 20 being covered with a reflection layer forming the reflector 2. In the example represented, the component 10 is applied on a carrier 21 (for example, PCB or ceramic). The housing 5 is fastened with one side face on the carrier 21. The radiation source 1 protrudes into the through-aperture of the housing 5 constituting the emission space 6. In the example represented, the reflector 2 is configured rotationally symmetrically with respect to a mid-axis 11. The reflector 2 is configured in the shape of a funnel and delimits, in an end region in the emission direction, an aperture surface 12 arranged perpendicularly to the mid-axis 11. The reflector 2 has, for example, a free face or a parabolic shape to deviate the electromagnetic radiation into the desired beam direction.

Furthermore, the emission side 4 of the radiation source 1 is arranged centrally with respect to the mid-axis 11.

Furthermore, a lens 3 protrudes with a first side face 7 at least partially into the emission space 6. The first side face 7 is configured rotationally symmetrically with respect to the mid-axis 11. Depending on the example selected, the first side face 7 of the lens 3 covers at least 80%, in particular at least 90%, of the aperture surface 12 of the reflector 2. In the example represented, the lens 3 connects to a plate part 9, which bears on a second side face 22 of the housing 5. The plate part 9 constitutes at least one edge region of the lens 3, which bears on the second side face 22 of the housing 5. The aperture surface 12 of the reflector 2 is therefore fully covered by the lens 3 and the plate part 9. Depending on the example selected, the lens 3 may comprise the plate part 9, that is to say it may be formed integrally and in material continuity with the plate part 9. Depending on the example selected, the lens 3 and the plate part 9 may also be formed in two parts and from different materials, the lens 3 being fastened on the plate part 9. The lens 3 and the plate part 9 may, for example, be formed from glass, silicone and/or plastic, for example, from epoxide.

The emission side 4 may have an area of, for example, 0.75×0.75 mm². In addition, the aperture surface 12 of the reflector 2 may, for example, have a diameter of 3 mm. Furthermore, the housing 5 may have a thickness parallel to the mid-axis 11 of 0.5 to 3 mm.

By virtue of the conical configuration of the first side face 7, despite the small component height, i.e. the small height of the reflector 2 parallel to the mid-axis 11 and the small height of the lens 3 parallel to the mid-axis 11, efficient and precise beam guiding of the electromagnetic radiation can be achieved. The electromagnetic radiation may, for example, be infrared light or visible light.

Figure 2:
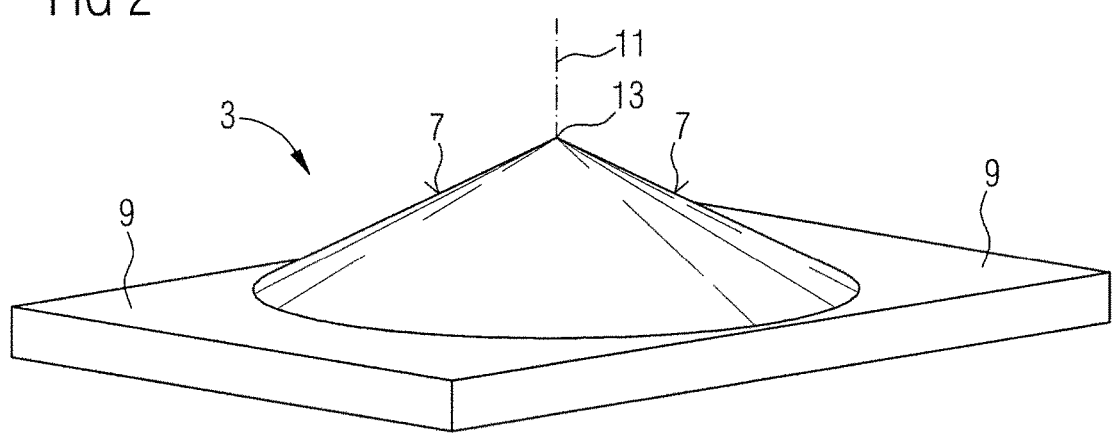
FIG. 2 shows a schematic perspective representation of a lens.

FIG. 2 shows a schematic perspective representation of the lens 3, which in the example represented is formed integrally and in material continuity with the plate part 9. In the example represented, the first side face 7 tapers conically in an end region to a vertex 13. Depending on the example selected, the lens 3 may have small curvatures, or curvature sections, on the first side face 7.

Figure 3:
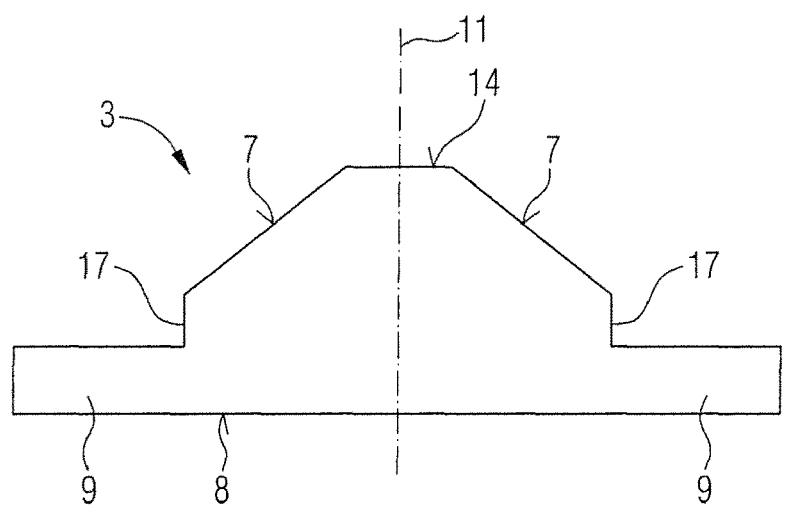
FIG. 3 shows a schematic cross section through a second example of the optoelectronic component.

FIG. 3 shows a schematic cross section of another example of a lens 3 in which the first side face 7 is configured frustoconically and merges into a plane face 14 in an end region. The face 14 is arranged perpendicularly to a mid-axis 11. The lens 3 is configured rotationally symmetrically with respect to the mid-axis 11. Furthermore, in the transition region between the first side face 7 and the plane face of the plate part 9, the lens 3 may have a transition region 17 having a different inclination relative to the mid-axis than the first side face 7. For example, the transition region 17 may be convexly or concavely curved. Furthermore, the transition region 17 may be arranged parallel to the mid-axis 11 and have a cylindrical shape.

Figure 4:
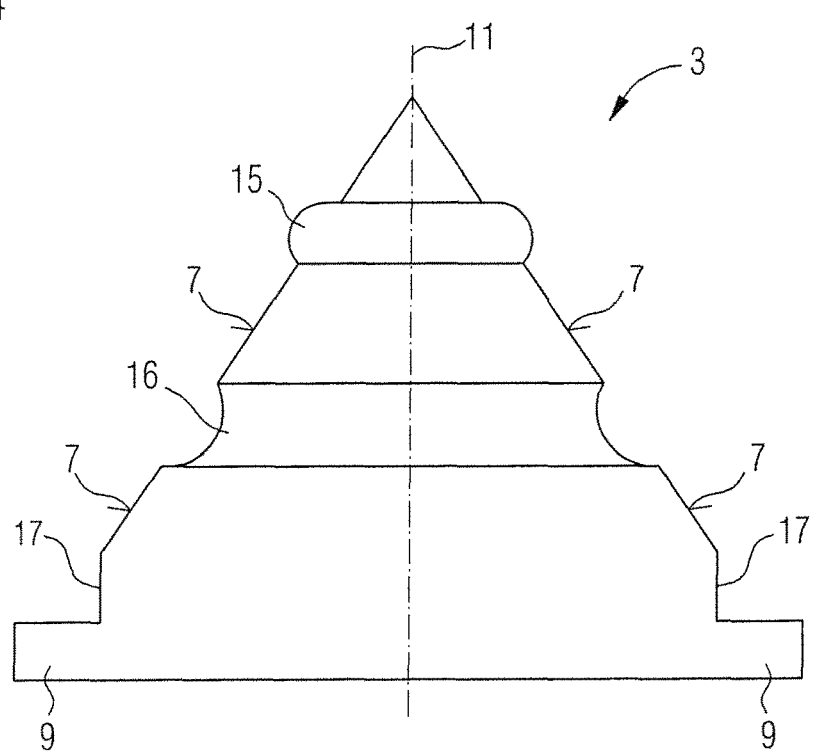
FIG. 4 shows a schematic cross section through a third example of the optoelectronic component.

FIG. 4 shows a schematic representation of another example of a lens 3 in which, for example, annular subsections 15, 16 of the first side face are configured to be convex or concave. In this example, although the optical quality is less than in the example of FIG. 1, efficient beam guiding is nevertheless achieved with this lens. The lens 3 of FIG. 4 is also configured rotationally symmetrically with respect to the mid-axis 11. Furthermore, in the transition region between the first side face 7 and the plane face of the plate part 9, the lens 3 may have a transition region 17 having a different inclination relative to the mid-axis than the first side face 7. For example, the transition region 17 may be convexly or concavely curved. Furthermore, the transition region 17 may be arranged parallel to the mid-axis 11 and have a cylindrical shape.

The second side face 8 of the lens 3 arranged opposite the first side face 7, may have various shapes for each example of the lens 3, independently of the shape of the first side face 7. For example, the second side face 8 may be configured to be plane, convex, concave or in the shape of a Fresnel structure or microprism structure.

Figure 5:
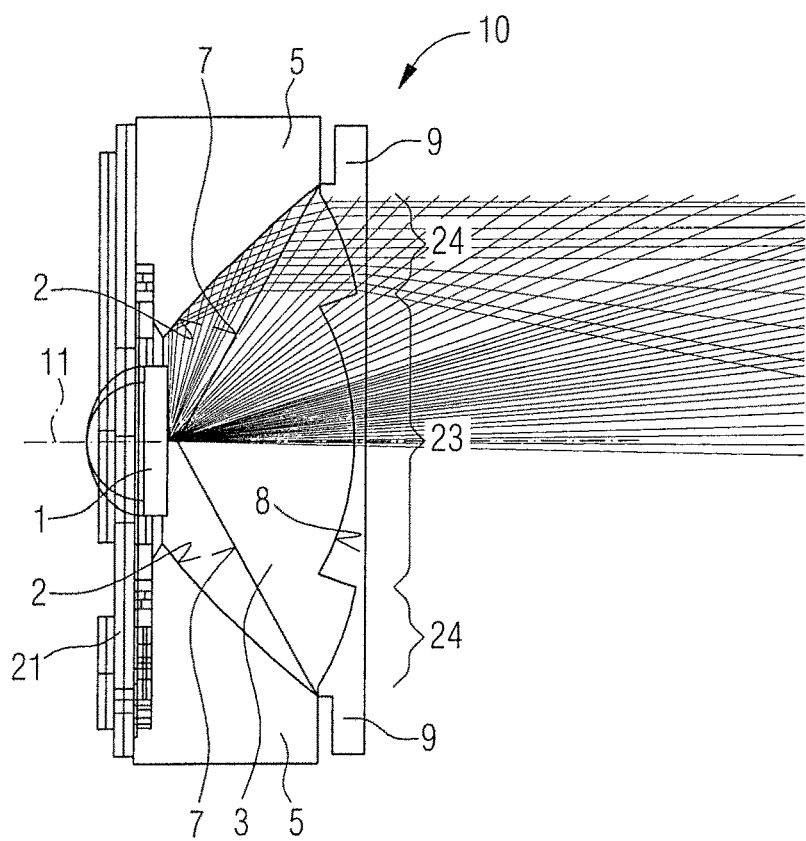
FIG. 5 shows a schematic cross section through a fourth example of the optoelectronic component.

FIG. 5 shows a schematic cross section of an optoelectronic component 10 having a lens 3 in which the second side face 8 is configured to be convex in a circular central region 23 and is configured as part of a cone in an annular outer radial edge region 24. The second side face 8 may be configured according to the desired beam guiding.

Figure 6:
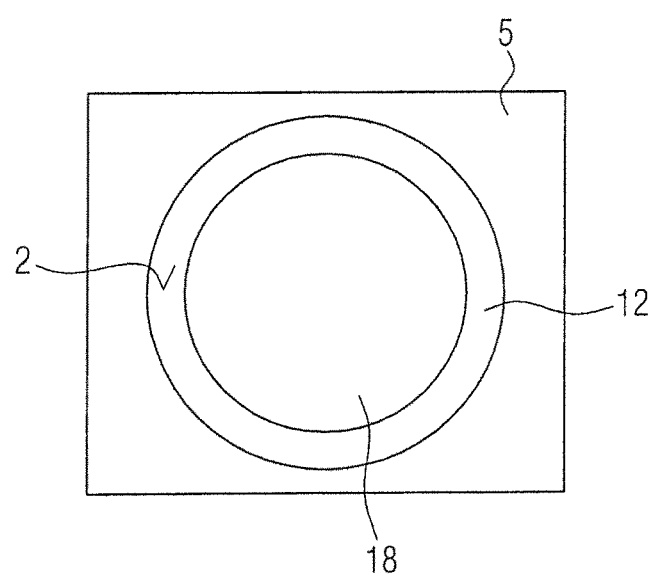
FIG. 6 shows a schematic view of an aperture surface of the reflector and a surface of the first side face of the lens.

FIG. 6 shows a schematic representation of a view of the aperture surface 12 of the reflector 2. Also schematically indicated is an effective surface 18 of the first side face 7, which is projected into the plane of the aperture surface 12. The greater the area of the aperture surface 12 covered by the first side face 7 of the lens 3, the lower the optical losses of the optoelectronic component 10. As already mentioned, the coverage may, for example, be 80% to 90% or more.

Figure 7:
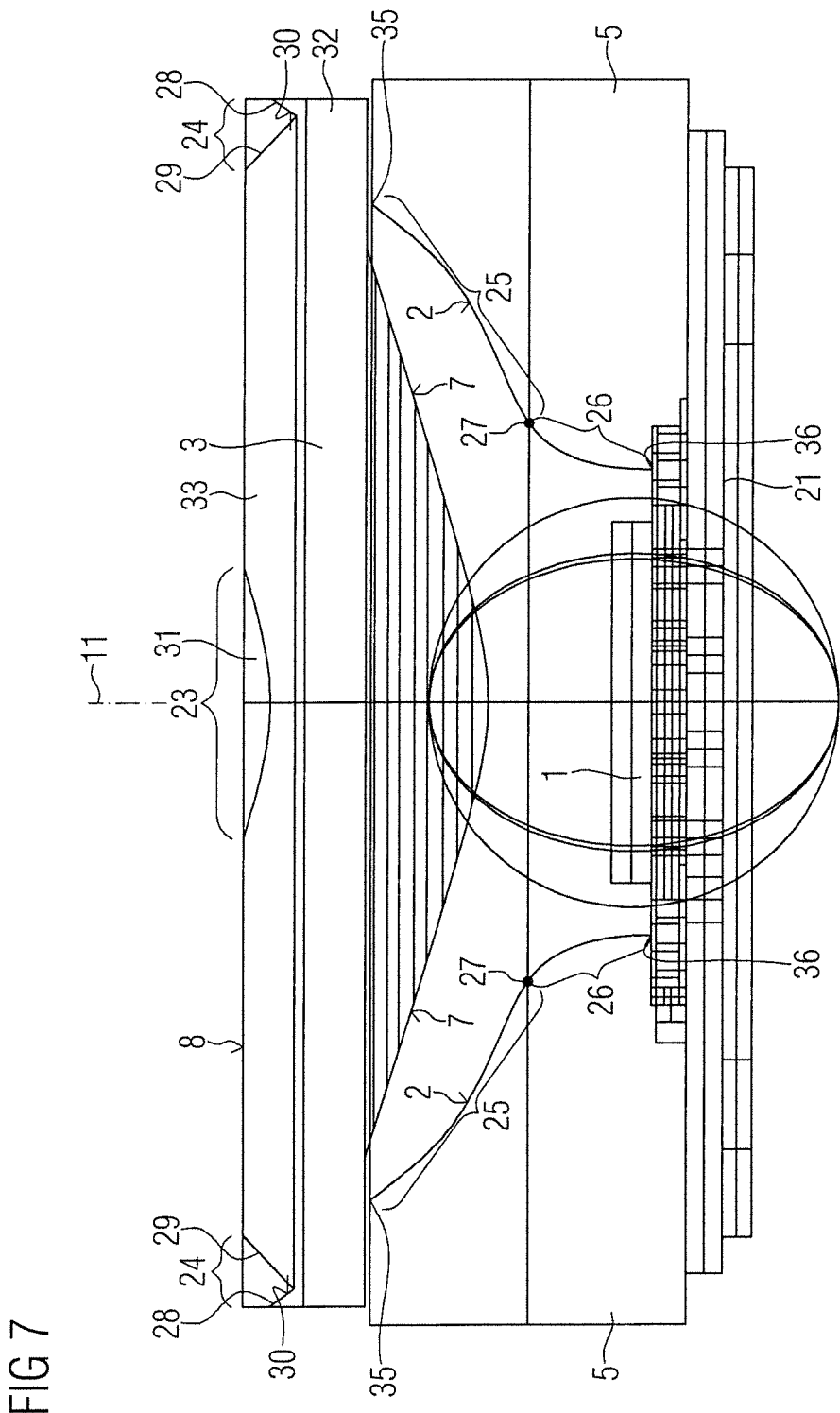
FIG. 7 shows a cross section through a fifth example of an optoelectronic component.

FIG. 7 shows a schematic cross section through another example of an optoelectronic component 10 having a carrier 21 on which a radiation source 1 is arranged. The radiation source 1 is enclosed by a reflector 2 formed on an inner wall of a housing 5. A lens 3 is arranged on the housing 5. The reflector 2 has a rotationally symmetrical shape with respect to the mid-axis 11.

Furthermore, in cross section through the mid-axis 11, the reflector 2 has a concave first section 25 and a convex second section 26. The concave first section 25 starts from an upper edge region 35 and extends in the direction of the radiation source 1. On an annular inflection line 27 defining a plane perpendicular to the mid-axis 11, the concave section 25 merges into the convex section 26. The inflection line 27 lies approximately half-way up the height of the reflector 2 in relation to the mid-axis 11. An aperture surface of the convex section 26 narrows in the direction of a lower end region 36 at the height of the radiation source 1 to a smallest aperture surface. The aperture surface of the reflector 2 therefore narrows constantly, starting from the upper end region 35, along the mid-axis 11 in the direction of the lower end region 36. The reflector 2 therefore essentially has an S shape in cross section.

The lens 3 has a first side face 7 configured rotationally symmetrically with respect to the mid-axis 11 and is configured to be conically tapering in the direction of the radiation source 1. The first side face 7 faces toward the radiation source 1. On a second side face 8 of the lens 3 arranged opposite the first side face 7, a circumferential annular groove 28 is formed in an edge region 24. The groove 28 has an inner face 29 and an outer face 30. The inner face 29 is arranged inclined inward and the outer face 30 is arranged inclined outward, relative to the mid-axis 11. In the example, as the reflector 2 is viewed from above, the groove 28 is arranged outside the aperture surface of the reflector 2 in the upper end region 35. As can be seen in FIG. 6, for manufacturing reasons the first side face 7 may cover not the entire aperture surface 12 of the reflector, but instead only a subsurface 18. Electromagnetic radiation can therefore be emitted between the reflector 2 and the first side face 7 without striking the first side face 7 of the lens 3. The groove 28, and in particular the inner face 29, are used to deviate this radiation in the direction of the mid-axis 11. In this way, the radiation is increased in the direction of the desired emission direction. Depending on the example selected, the groove 28 may also be arranged inside the aperture surface of the reflector 2.

In the middle, furthermore, the second side face 8 has a recess 31 configured rotationally symmetrically with respect to the mid-axis 11 and has the shape of a part of a sphere and/or a conical shape. The lens 3 may be formed integrally or in two parts in the form of plates 32, 33. The two plates 32, 33 may be arranged perpendicularly to the mid-axis 11, the first plate 32 having the first side face 7 and the second plate 33 having the second side face 8. The groove 28 and the recess 31 improve the focusing onto the desired emission direction. Depending on the example selected, the lens 3 may have only the groove 28 or only the recess 31. The reflector 2 represented in FIG. 7 may also be combined with the lenses of the previous figures. Furthermore, the lens 3 represented in FIG. 7 may also be combined with the reflectors of the previous figures.

Figure 8:
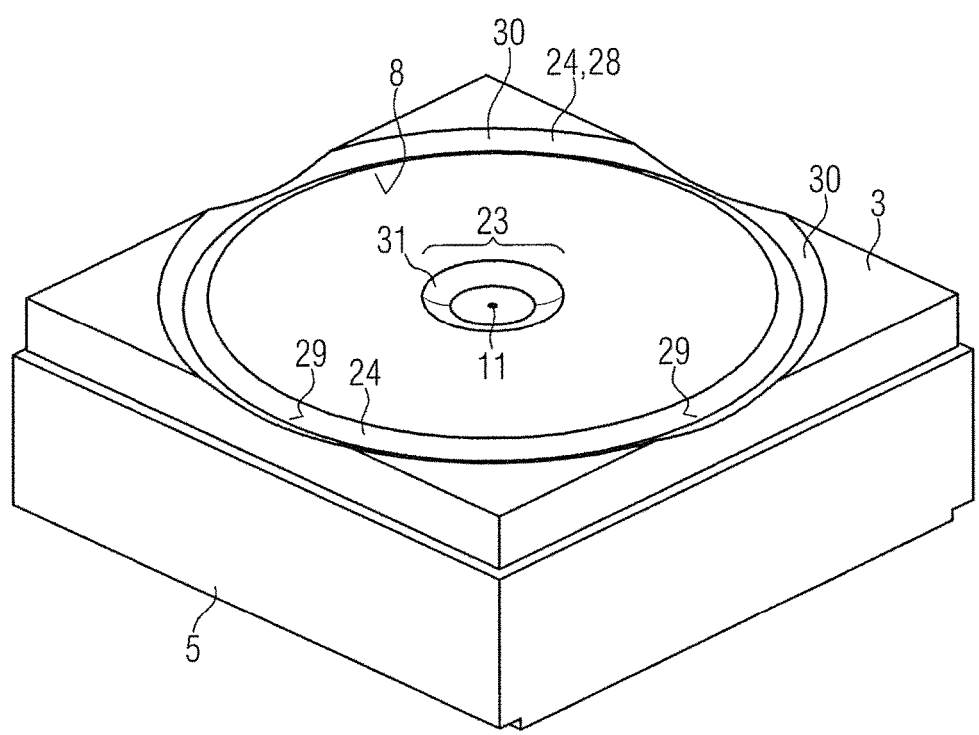
FIG. 8 shows a schematic perspective plan view of the fifth example.

FIG. 8 shows a schematic perspective plan view of the arrangement of FIG. 7. In the example represented, the lens 3 has a square shape in the region of the second side face 8. Depending on the example selected, the lens 3 may also have a circular shape in the region of the side face 8.

One basic idea of the present examples of the optoelectronic component 10 is that electromagnetic radiation striking the first side face 7 of the lens 3 directly is refracted in the direction of the optical axis and then refracted further by a further optical element, for example, a convex second side face or a second lens, in a second step back into the optical axis direction. Furthermore, the electromagnetic radiation reflected by the first side face 7 of the lens 3 is reflected outward onto the reflector 2. From the reflector 2, the reflected rays are reflected back again in the direction of the first side face 7 of the lens 3. Equally, the electromagnetic radiation reflected by the reflector 2 is in addition refracted in the direction of the optical axis by the conical shape of the first side face 7 of the lens 3. The reflector can therefore be configured to be flatter, i.e. shorter in the beam direction. This allows a very flat reflector design that achieves high beam intensities, or narrow-angle emission of the electromagnetic radiation. An improved efficiency is achieved in this way because of the lower optical losses. Furthermore, the fraction of the electromagnetic radiation which is not deviated into the optical axis is reduced.

Although my components have been illustrated and described in detail by preferred examples, this disclosure is not restricted by the examples disclosed, and other variants may be derived therefrom by those skilled in the art without departing from the protective scope of the appended claims.

This application claims priority of DE 10 2015 108 499.6, the subject matter of which is incorporated herein by reference.

The invention claimed is:

1. An optoelectronic component comprising at least one radiation source that produces electromagnetic radiation, a reflector, and a lens, wherein the reflector deviates a part of the radiation of the radiation source into a desired beam direction, the lens deviates at least a part of the radiation of the radiation source into the desired beam direction, the lens has a first side face which is conical at least in some areas, the first side face faces toward the radiation source, and the reflector has a concave first section and a second convex section.

2. The component according to claim 1, wherein the first side face is configured to be fully conical.

3. The component according to claim 1, wherein the reflector delimits an emission space, the reflector has an emission aperture in an end region in the emission direction, and the first side face covers at least 80% of the emission aperture.

4. The component according to claim 1, wherein the first side face covers at least 90% of the emission aperture, the reflector delimits an emission space, the reflector has an emission aperture in an end region in the emission direction, and the first side face covers at least 80% of the emission aperture.

5. The component according to claim 1, wherein the lens has at least partially a convex surface on a second side face arranged opposite the first side face.

6. The component according to claim 1, wherein the lens has at least partially a Fresnel structure on a second side face arranged opposite the first side face.

7. The component according to claim 1, wherein the reflector is formed on an inner side of a housing, the lens being fastened with an edge region on a side face of the housing.

8. The component according to claim 1, wherein the first and second sections merge into one another, a cross section of the first section narrows in the direction of the radiation source, and a cross section of the second section narrows in the direction of the radiation source.

9. The component according to claim 1, wherein the reflector is formed on an inner side of a housing, the lens being fastened with an edge region on a side face of the housing, and the second side face of the lens has a circumferential groove.

10. The component according to claim 1, wherein the lens has at least partially a convex surface on a second side face arranged opposite the first side face, and the second side face of the lens has a circumferential groove.

11. The component according to claim 1, wherein the second side face of the lens has a circumferential groove.

12. The component according to claim 1, wherein the second side face of the lens has a central recess.

13. The component according to claim 1, wherein the second side face of the lens has a central recess.

14. The component according to claim 1, wherein the lens has at least partially a convex surface on a second side face arranged opposite the first side face, and the second side face of the lens has a central recess.

15. The component according to claim 1, wherein the reflector is formed on an inner side of a housing, the lens being fastened with an edge region on a side face of the housing, wherein the second side face of the lens has a circumferential groove.

* * * * *